United States Patent [19]
Weitzel et al.

[11] Patent Number: 5,399,893
[45] Date of Patent: Mar. 21, 1995

[54] DIODE PROTECTED SEMICONDUCTOR DEVICE

[75] Inventors: Charles E. Weitzel, Mesa; David J. Halchin, Chandler, both of Ariz.

[73] Assignee: Motorola, Inc., Schaumburg, Ill.

[21] Appl. No.: 111,326

[22] Filed: Aug. 24, 1993

[51] Int. Cl.[6] .................. H01L 29/06; H01L 29/78
[52] U.S. Cl. .................. 257/355; 257/356; 257/259
[58] Field of Search .............. 257/256, 259, 280, 360, 257/281, 282, 355, 356

[56] References Cited

U.S. PATENT DOCUMENTS

| 4,498,093 | 2/1985 | Allyn et al. | 257/259 |
| 5,046,044 | 9/1991 | Houston et al. | 365/156 |

FOREIGN PATENT DOCUMENTS

| 58-51577 | 3/1983 | Japan | 257/256 |
| 62-208655 | 9/1987 | Japan | 257/360 |
| WO8202799 | 8/1982 | WIPO | 257/256 |

OTHER PUBLICATIONS

M. Hagio et al., "Monlithic Integration of Surge Protection Diodes into Low-Noise GaAs MESFET's," IEEE Transactions on Electron Devices, vol. ED-32, No. 5, May 1985, pp. 892-895.

Primary Examiner—J. Carroll
Attorney, Agent, or Firm—Aaron B. Bernstein

[57] ABSTRACT

A diode protected semiconductor device appropriate for the output of a radio frequency amplifier, which can withstand substantial power reflection due to output impedance mismatch, is provided. The device may be implemented monolithically, in the form of a field effect transistor (FET) (14) having a back to back diode pair (17) connecting the drain (18) to the source (19). The FET comprises multiple transistor portions (28) coupled together. The diode pair comprises corresponding diode pair portions (37) coupled together. The configuration provides easy integration of the diode pair (17) into typical FET structures.

11 Claims, 2 Drawing Sheets

DIODE PROTECTED SEMICONDUCTOR DEVICE

BACKGROUND OF THE INVENTION

The present invention relates, in general, to semiconductor devices, and more particularly, to diode protected semiconductor devices.

Radio frequency (RF) amplifiers, used for example in telecommunications, are sometimes subjected to severe impedance mismatches at their output. At radio frequencies, the impedance mismatch causes significant power to be reflected back into the output of the RF amplifier. Consequently, the circuits composing the RF amplifier must be rugged in order to prevent failure in the event of significant reflected power into the output.

Typically, an RF amplifier includes an RF transistor driving the output. According to industry standards, the RF transistor must be designed to survive a 20:1 impedance mismatch at its output. A 20:1 impedance mismatch can subject the output of the transistor to up to four times the supply voltage across the source and drain. Accordingly, the RF transistor must be designed to resist breakdown at up to four times the supply voltage.

Conventionally, a higher breakdown in an RF transistor is achieved by lowering the channel doping of the device. Unfortunately, lower channel doping increases the transistor's on resistance. A higher on resistance negatively impacts important parameters such as gain, efficiency, output power, etc.

Accordingly, what is needed is a scheme for output impedance mismatch protection which does not require lowering channel doping. It would be desirable if the protection could be easily integrated into existing RF transistor designs.

SUMMARY OF THE INVENTION

Generally stated, the present invention provides a diode protected semiconductor device. The invention includes a transistor having a control terminal, a first terminal and a second terminal. Additionally, the invention includes a first diode having a first terminal and a second terminal. The first terminal of the first diode is electrically coupled to the first terminal of the transistor. The invention further includes a second diode comprising a first terminal and a second terminal. The first terminal of the second diode has the same polarity as the first terminal of the first diode, and the second terminal of the second diode has the same polarity as the second terminal of the first diode. The second terminal of the second diode is electrically coupled to the second terminal of the first diode. Additionally, the first terminal of the second diode is electrically coupled to the second terminal of the transistor.

DETAILED DESCRIPTION OF THE DRAWINGS

Figure 1:
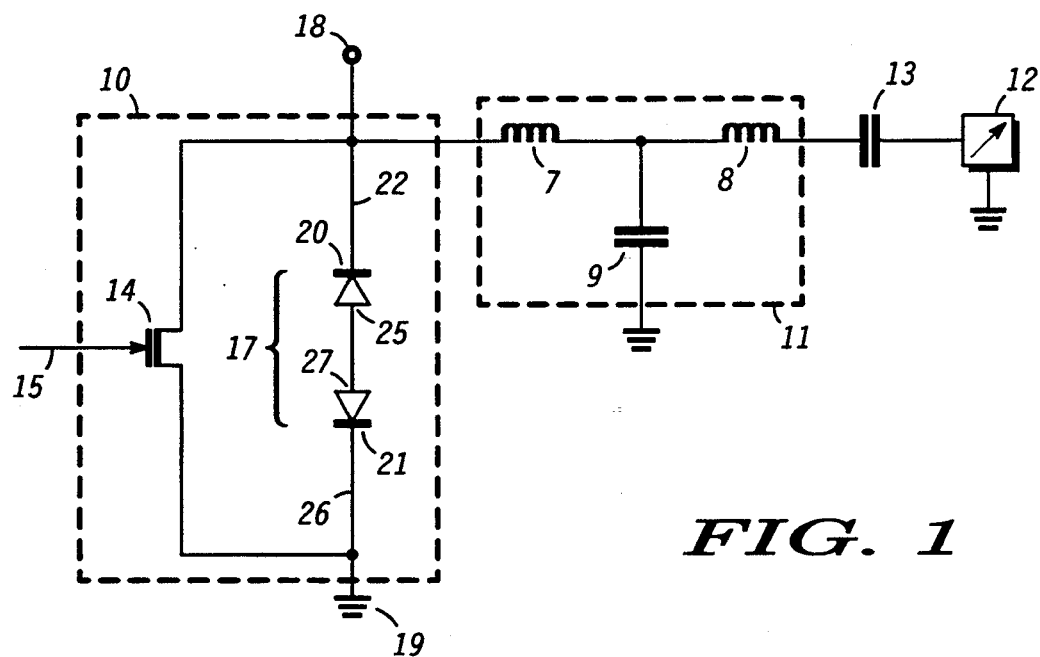
FIG. 1 is a simplified circuit schematic illustrating a circuit in accordance with the preferred embodiment of the present invention employed in a typical environment.

FIG. 1 is a simplified circuit schematic showing a circuit in accordance with the preferred embodiment of the present invention employed in a typical environment. More specifically, FIG. 1 represents an RF amplifier coupled by a matching network to a load. The RF amplifier includes diode protected circuit 10. The output of diode protected circuit 10 is coupled to the input of impedance matching network 11. The output of impedance matching network 11 is capacitively coupled to load 12. This circuit represents, for example, the transmit side of telecommunications apparatus. The signal to be transmitted is amplified by circuit 10. The amplified signal is fed through matching network 11 to minimize reflection from load 12. Matching network 11 representatively comprises inductors 7 and 8 and capacitor 9. Capacitive coupler 13 is provided to prevent DC voltages from passing through to load 12.

According to industry standards, the RF amplifier is typically designed to be compatible with a 50 ohm load. With respect to FIG. 1, circuit 10 and matching network 11 are designed by well known methods to be compatible with load 12 which is a 50 ohm load. However, during operation, it is possible for load 12 to be accidentally disconnected, shorted, or altered in some other way so that it no longer appears as 50 ohms. Consequently, industry standards demand that the RF amplifier be capable of withstanding up to a 20:1 ratio in load mismatch. It is well understood that such a load mismatch reflects undesired power back into the amplifier, subjecting the output transistor of the amplifier to as much as four times the supply voltage.

According to the present invention, a diode protected circuit is provided to protect the output transistor under such circumstances. More specifically, according to the preferred embodiment the diode protected circuit 10 comprises field effect transistor (FET) 14. FET 14 includes control terminal 15, first terminal 18 and second terminal 19. First terminal 18 is coupled to a supply voltage and second terminal 19 is coupled to ground. Control terminal 15 is the gate of the FET. As is well understood, the RF signal to be transmitted is coupled to control terminal 15.

According to the preferred embodiment of the present invention, circuit 10 also comprises diode pair 17. Diode pair 17 includes first diode 20 and second diode 21. First diode 20 includes a first terminal 22 and a second terminal 25. First terminal 22 is the cathode of the diode. Correspondingly, second terminal 25 is the anode of the diode. Similarly, diode 21 comprises first terminal 26 and second terminal 27. Second terminal 25 of diode 20 and second terminal 27 of diode 21 are coupled together. Additionally, first terminal 22 of diode 20 is coupled to first terminal 18 of FET 14. Furthermore, first terminal 26 of diode 21 is coupled to second terminal 19 of FET 14.

As described, the diode pair provides protection from significant reflected power at the output of the amplifier including circuit 10. Specifically, when the voltage at terminal 18 rises to a predetermined level, the diode pair 17 breaks down allowing current to pass through diode pair 17 to grounded terminal 19. By using the described circuit in accordance with the present invention, the channel of FET 14 does not have to be unduly lightly doped, which would undesirably raise the on resistance of the device and severely negatively impact the performance of the device.

Figure 2:
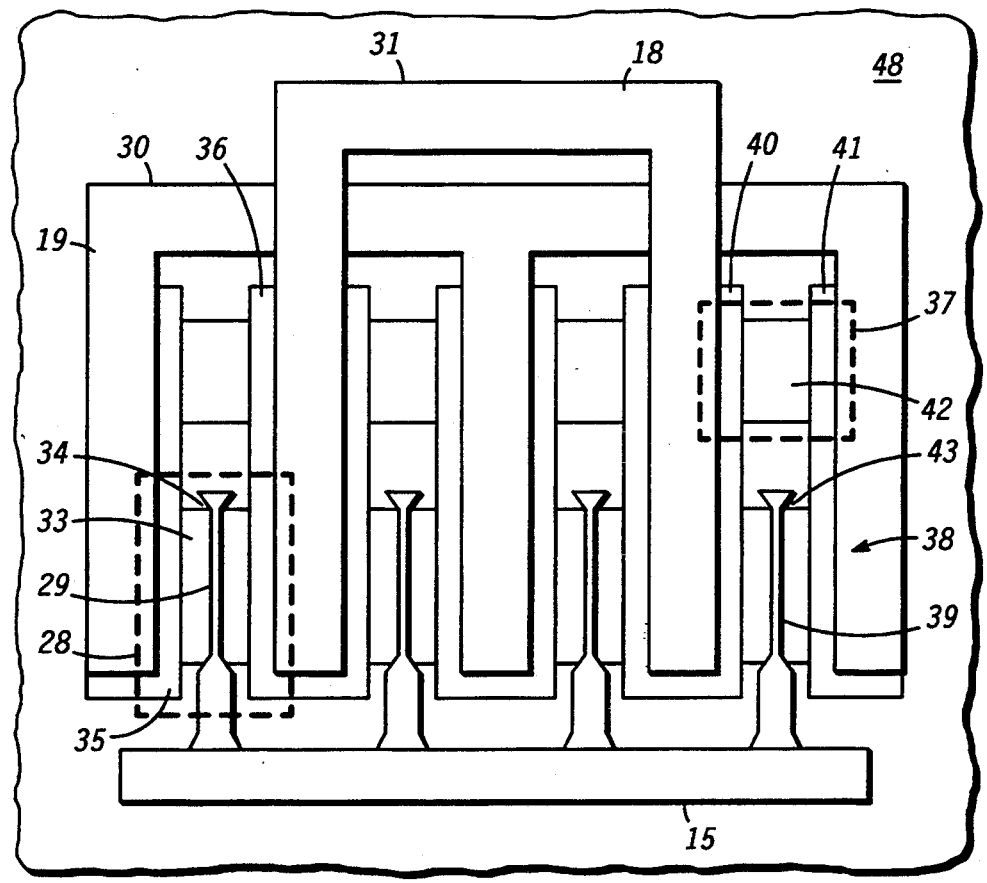
FIG. 2 is a top view of a circuit in accordance with the preferred embodiment of the present invention implemented as a solid state electronic device.

FIG. 2 illustrates the diode protected device in accordance with one embodiment of the present invention implemented as a monolithic semiconductor device. It will be understood that the device shown in FIG. 2 is formed in the surface of a semiconductor substrate with well known photolithographic and implantation methods. In the preferred embodiment, the semiconductor substrate is a III-V structure which is well known to be useful for radio frequency analog circuits.

The structure shown in FIG. 2 is a relatively conventional multi-gate RF field effect transistor with the modifications providing a diode pair in accordance with the present invention.

Portions of the solid state electronic device shown in FIG. 2 correspond to portions of the schematic circuit 10 shown in FIG. 1. For example, FIG. 2 shows control terminal (gate) 15, first terminal (drain) 18 and second terminal (source) 19. The FET device of FIG. 2 is a MEtal on Semiconductor Field Effect Transistor (MESFET). The MESFET comprises a number of transistor portions represented by transistor portion 28, surrounded by the dotted line box. Transistor portion 28 comprises elongated gate finger 29. Gate finger 29 overlies channel region 33. Channel region 33 is N-type and gate finger 29 is an elongated electrode formed directly on top of channel region 33 according to well known processing methods. Gate finger 29 has a predetermined length and an extent 34.

Transistor portion 28 further comprises elongated N+ doped region 35 which forms the source of the FET. Similarly, transistor portion 28 includes elongated N+ doped region 36 which forms the drain of the FET. It will be understood that N+ regions 35 and 36 provide ohmic regions as required for ohmic contact to source/drain regions of the MESFET structure.

Doped regions 35 and 36 are formed opposite one another, parallel to elongated gate finger 29. All of the elongated N+ regions which form sources of the respective transistor portions are electrically coupled with metal layer 30 of source 19. Similarly, all of the elongated N+ regions which form drains of the respective transistor portions are electrically coupled with metal layer 31 of drain 18.

The device shown in FIG. 2 further comprises a diode pair corresponding to diode pair 17 shown in FIG. 1. The diode pair is composed of diode pair portions represented by diode pair portion 37 surrounded by the dotted line box. As is evident from FIG. 2, there is a diode pair portion corresponding to each of the transistor portions. Diode pair portion 37 includes first doped region 40, second doped region 41 and third doped region 42. First doped region 40 is and extension of the elongated N+ drain region of the corresponding transistor portion. Similarly, second doped region 41 is and extension of the elongated N+ source region of the corresponding transistor portion. This configuration makes the diode pair portions particularly easy to integrate into typical FET designs which commonly comprise a plurality of elongated transistor portions like portion 28.

N+ region 40 forms a part of the cathode of diode 20 in FIG. 1, coupled to drain 18 of the FET. Similarly, N+ region 41 forms a part of the cathode of diode 21 in FIG. 1, coupled to source 19 of the FET. P— region 42 forms the anode of each of the diodes, which are of course coupled to each other. Consequently, regions 40, 42 and 41, and the analogous components of the other diode pair portions, combine to effectively form a diode pair like that shown schematically as diode pair 17, in FIG. 1. Diode pair 17 is electrically coupled to transistor 14 as shown in FIG. 1.

More specifically, metallization layer 31 of terminal 18 of the FET electrically couples all of the drains of the transistor portions as well as all of the first cathode regions (e.g. region 40) of the diode pair portions. Similarly, metallization layer 30 of terminal 19 of the FET couples all of the source regions of the diode portions as well as all of the second cathode regions (e.g. region 41) of the diode pair portions.

As illustrated by FIG. 2, the respective N+ elongated drain and source regions of the transistor portions (e.g. regions 36 and 35) extend past the extent of the elongated gate finger (e.g. extent 34 of gate finger 29). Consequently, region 40 forms not only a cathode of the diode pair, but also the drain of transistor portion 38. Similarly, region 41 forms not only a cathode of the diode pair, but also the source of transistor portion 38. In the preferred embodiment, P— region 42, which connects N+ regions 41 and 42 to form the diode pair, has a width in the direction parallel to elongated N+ regions. The width is preferably within the range of 40-70% of the length of elongated gate finger 39. Furthermore, P— region 42 is spaced from extent 43 of gate finger 39 a distance which is 20-30% of the length of gate finger 39. This spacing, however, is mostly a function of photolithographic limitations and well known shorting or breakdown considerations.

Specifically, in the preferred embodiment the length of gate finger 39, as well as all the other gate fingers, is 55 microns. The width of P— region 42 is 35 microns. P— region 42 is spaced from extent 43 of gate finger 39, a distance of 15 microns.

Figure 3:
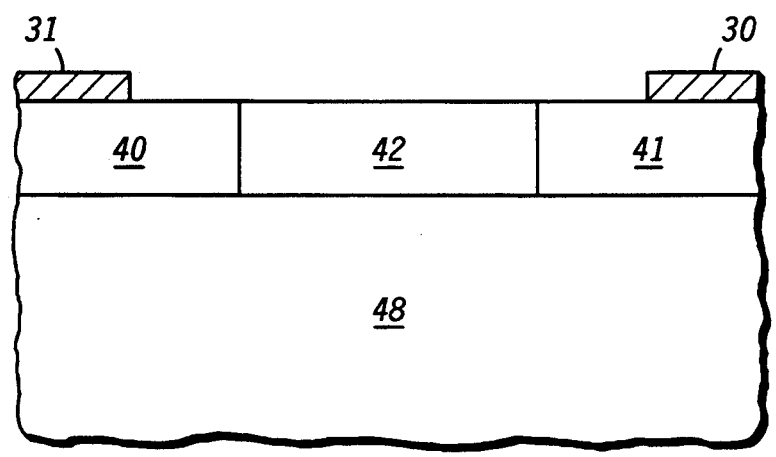
FIG. 3 is a cross-section of a portion of the diode pair included in the device of FIG. 2.

FIG. 3 is a cross-section of diode pair portion 37 shown in FIG. 2. Metal layer 31 is the metal layer of source terminal 19 shown in FIG. 2. Similarly, metal layer 30 is the metal layer of drain terminal 18 shown in FIG. 2. Diode pair portion 37 is formed in semiconductor substrate 48. As previously discussed, diode pair portion 37 comprises a first end comprising region 40 which is an N+ region forming a cathode of the diode pair. Additionally, diode pair portion 37 comprises P— region 42 which forms the anodes of both diodes of the diode pair. P— region 42 joins N+ region 40 to N+ region 41, located at the second end of diode pair portion 37.

In the preferred embodiment, metal layers 30 and 31 extend to within approximately one micron of the inner edge (toward region 42) of N+ regions 41 and 40, respectively. The one micron space prevents metal of the metal layers from interfering with electronic activity at the interface between the N+ and P— regions. If the metal layers are too close to the respective N/P interfaces, the electrical characteristics of the diode pair will be more difficult to control.

Additionally, in the preferred embodiment, N+ regions 40 and 41 have the same depth into semiconductor substrate 48 as P— region 42. Although a diode pair would still be formed if, for example, P— region 42 extended further into structure 48, undesirable capacitance would be created. Consequently, in the preferred embodiment, regions 40, 41 and 42 are of the same thickness.

Figure 4:
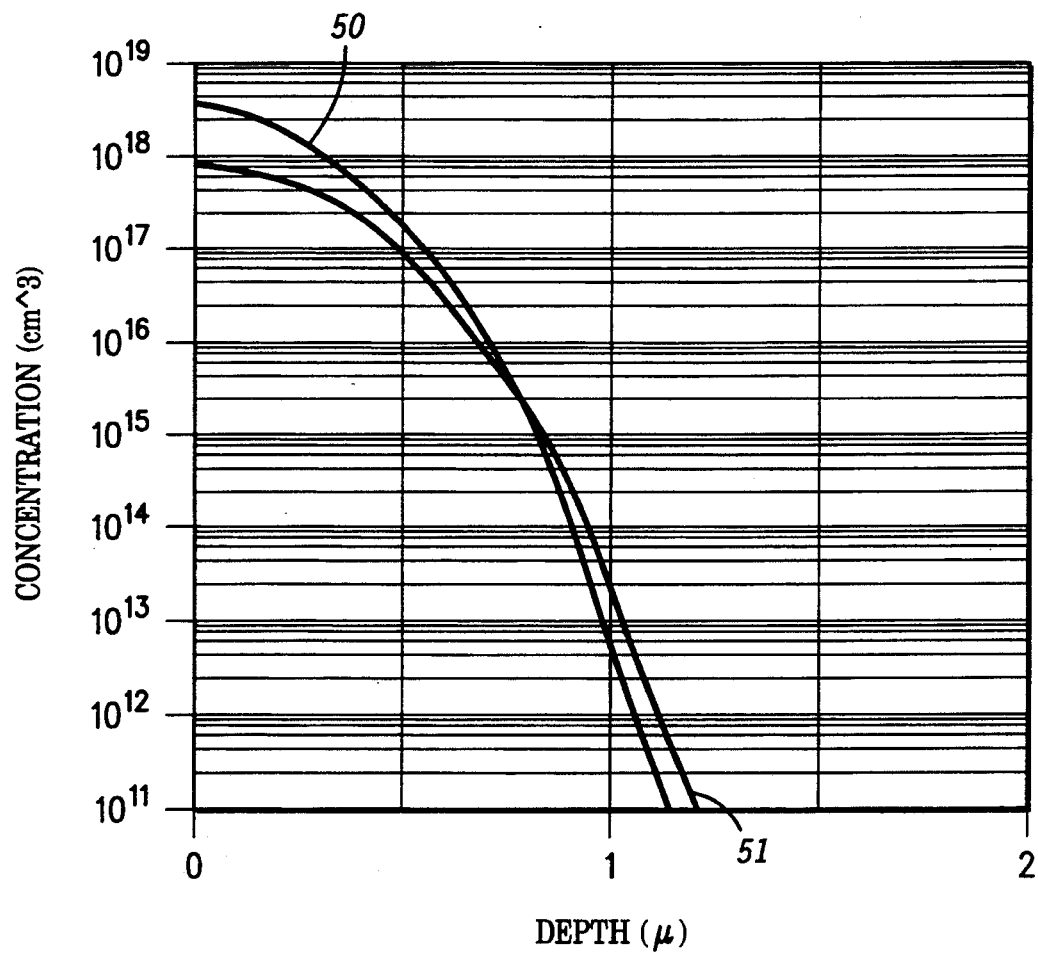
FIG. 4 is a graph illustrating the doping profile of the structure shown in FIG. 3.

FIG. 4 is a graph illustrating the specific doping profile of the preferred diode pair in accordance with the present invention. Curve 50 represents the doping profile of all of the elongated N+ portions which form the source/drain regions of the FET as well as the cathodes of the diode pair. Specifically, in the preferred embodiment, silicon is preferred as an N+ dopant, implanted at 100 Kev with a density of 3e13 cm$^2$. Curve 51 represents the doping profile of all of the P− regions of the diode pair portions. Specifically, beryllium is preferred as a P dopant, at an implant energy of 30 Kev, with a density of 9e12 cm$^2$. The graph of FIG. 4 reflects that the N+ and P− regions are doped to the same depth, as described above. It will be understood that variations of dopants, doping parameters, etc., may be used depending on the particular device application.

By now it should be appreciated that a diode protected semiconductor device has been provided which is protected from severe output impedance mismatches. Furthermore, unlike conventional methods, the protection does not negatively impact the performance of the semiconductor device. Additionally, a diode protected semiconductor device is provided which can easily be integrated into conventional transistor structures.

We claim:

1. A diode protected semiconductor device comprising:
   a transistor comprising a plurality of transistor portions, each transistor portion comprising an elongated gate finger having an extent, an elongated drain region and an elongated source region, the elongated drain region and the elongated source region disposed on opposite sides of and parallel to the elongated gate finger;
   a diode pair comprising a plurality of diode pair portions, each diode pair portion corresponding to one of the transistor portions, each diode pair portion comprising first, second and third doped regions; and
   wherein the elongated drain region and elongated source region extend past the gate finger extent to form the first and second doped regions, respectively, and wherein the third doped region connects the first and second doped regions.

2. The device of claim 1, wherein the transistor comprises a MESFET.

3. The device of claim 1, wherein the gate finger has a length and the third doped region has a width, wherein the third doped region width is substantially within the range of 40–70% of the gate finger length.

4. The device of claim 1, wherein the first and second doped regions comprise n-type regions and the third doped region comprises a p-type region.

5. The device of claim 1, wherein the gate finger has a length and wherein the third doped region is spaced from the gate finger extent by a distance substantially in the range of 20–30% of the gate finger length.

6. A diode protected semiconductor device comprising;
   a semiconductor substrate;
   a transistor formed in the semiconductor substrate, the transistor comprising a plurality of transistor portions, each transistor portion comprising a control terminal, a first terminal and a second terminal;
   a diode pair formed in the semiconductor substrate, the diode pair comprising a plurality of diode pair portions corresponding to the plurality of transistor portions, the diode pair portions each comprising a first end and a second end, the first end coupled to the first terminal of the transistor and the second end coupled to the second terminal of the transistor;
   wherein the transistor comprises a FET and the transistor portions each comprise a source region and a drain region, the drain region coupled to the first end of the diode pair portion and the source region coupled to the second end of the diode pair portion; and
   wherein the control terminal comprises an elongated electrode comprising an extent, and wherein the drain region comprises a first elongated doped region parallel to the elongated electrode and extending further than the extent of the elongated electrode to form the first end of the diode pair portion, and wherein the source region comprises a second elongated doped region parallel to the elongated electrode and extending further than the extent of the elongated electrode to form the second end of the diode pair portion.

7. The device of claim 6, wherein the first and second elongated doped regions have a first doping type and wherein the first elongated doped region is joined to the second elongated doped region by a third doped region having a second doping type opposite the first doping type.

8. The device of claim 7, wherein the third doped region has a width and the elongated electrode has a length, the width of the third doped region being substantially in the range of 40–70% of the length of the elongated electrode.

9. A diode protected semiconductor device comprising:
   a semiconductor substrate;
   a transistor formed in the semiconductor substrate, the transistor comprising a plurality of transistor portions, each transistor portion comprising a control terminal, a first terminal and a second terminal;
   a diode pair formed in the semiconductor substrate, the diode pair comprising a plurality of diode pair portions corresponding to the plurality of transistor portions, the diode pair portions each comprising a first end and a second end, the first end coupled to the first terminal of the transistor and the second end coupled to the second terminal of the transistor;
   wherein the transistor portions each comprise a source region and a drain region, the drain region coupled to the first end of the diode pair portion and the source region coupled to the second end of the diode pair portion; and
   wherein the control terminal comprises an elongated electrode comprising an extent, and wherein the drain region comprises a first elongated doped region parallel to the elongated electrode and extending further than the extent of the elongated electrode to form the first end of the diode pair portion, and wherein the source region comprises a second elongated doped region parallel to the elongated electrode and extending further than the extent of the elongated electrode to form the second end of the diode pair portion.

10. The device of claim 9, wherein the first and second elongated doped regions have a first doping type and wherein the first elongated doped region is joined to the second elongated doped region by a third doped region having a second doping type opposite the first doping type.

11. The device of claim 10, wherein the third doped region has a width and the elongated electrode has a length, the width of the third doped region being substantially in the range of 40–70% of the length of the elongated electrode.

* * * * *